(12) United States Patent
Huang

(10) Patent No.: US 11,638,347 B2
(45) Date of Patent: Apr. 25, 2023

(54) CIRCUIT BOARD AND DISPLAY APPARATUS

(71) Applicant: HKC Corporation Limited, Shenzhen (CN)

(72) Inventor: Beizhou Huang, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 331 days.

(21) Appl. No.: 17/044,147

(22) PCT Filed: Nov. 15, 2018

(86) PCT No.: PCT/CN2018/115526
§ 371 (c)(1),
(2) Date: Sep. 30, 2020

(87) PCT Pub. No.: WO2020/087572
PCT Pub. Date: May 7, 2020

(65) Prior Publication Data
US 2021/0161001 A1  May 27, 2021

(30) Foreign Application Priority Data

Oct. 31, 2018 (CN) .......................... 201821787979.1

(51) Int. Cl.
*H05K 1/00* (2006.01)
*H05K 1/02* (2006.01)

(52) U.S. Cl.
CPC ... *H05K 1/0254* (2013.01); *H05K 2201/0746* (2013.01); *H05K 2201/10128* (2013.01)

(58) Field of Classification Search
CPC ......... H05K 1/0254; H05K 2201/0746; H05K 2201/10128
See application file for complete search history.

(56) References Cited

U.S. PATENT DOCUMENTS

| | | | |
|---|---|---|---|
| 6,479,761 B1* | 11/2002 | Paquette | H05K 1/0216 174/262 |
| 2005/0231889 A1* | 10/2005 | Tsuji | H01G 4/232 257/E23.079 |
| 2014/0176840 A1* | 6/2014 | Hashido | H05K 9/0054 349/33 |
| 2019/0363415 A1* | 11/2019 | Shen | H01P 1/387 |
| 2022/0247058 A1* | 8/2022 | Len | H05K 1/0263 |

FOREIGN PATENT DOCUMENTS

| | | |
|---|---|---|
| CN | 101043788 A | 9/2007 |
| CN | 103493371 A | 1/2014 |
| CN | 207252014 U | 4/2018 |
| CN | 207692153 U | 8/2018 |

OTHER PUBLICATIONS

International Search Report dated Aug. 1, 2019 issued in corresponding International Application No. PCT/CN2018/115526, filed Nov. 15, 2018, 2 pages.

* cited by examiner

*Primary Examiner* — Pete T Lee
(74) *Attorney, Agent, or Firm* — Rosenberg, Klein & Lee

(57) ABSTRACT

A circuit board, comprising a connector, screw holes and first ground, wherein first ground terminals of the connector and the screw holes are respectively connected to the first ground, so as to carry out electrostatic discharge by means of the first ground; and the first ground is isolated from ground wires on the circuit board.

14 Claims, 3 Drawing Sheets

US 11,638,347 B2

CIRCUIT BOARD AND DISPLAY APPARATUS

CROSS REFERENCE TO RELATED APPLICATIONS

The present application claims priority to Chinese Patent Application No. 201821787979.1, entitled "CIRCUIT BOARD AND DISPLAY APPARATUS", and filed on Oct. 31, 2018, the entire content of which is incorporated herein by reference.

TECHNICAL FIELD

The present application relates to the field of electrostatic discharge, and more particularly to a circuit board and a display device.

BACKGROUND

The statements herein merely provide background information related to the present application and do not necessarily constitute prior art.

With the continuous development of electronic technology, the application of electronic device has become more and more extensive, ranging from high-tech fields such as aerospace device to electronic chips. Electro-Static Discharge (ESD) is everywhere, how to protect ESD to ensure the normal operation of device is a key problem that electronic products need to overcome at present.

Among them, in the panel industry, an ESD protection design is required to make the circuit board. The existing ESD protection design is to discharge static electricity to the ground of the circuit board through the screw hole connection resistance, in which the internal components of the circuit board share the same ground with the resistance of the connection screw hole. Such ESD protection design does not solve the problem that the static electricity cannot be discharged during the assembly process of the circuit board, and during the operation of the circuit board, the inherent discharged path of the ESD is likely to interfere with the stability of the components and signals in the circuit board, which will cause the circuit board to not work properly.

SUMMARY

The embodiment of the present application provides a circuit board, including:

a connector configured to connect an onboard system of the circuit board to an external system, wherein the connector is provided with a first ground terminal and connected to a first ground; and a screw hole connected to the first ground to discharge static electricity through the first ground, wherein the first ground is isolated from the ground wire of the circuit board.

In one embodiment, the ground wire is provided with a plurality of second ground terminals, one side of the screw hole and one side of the connector are respectively provided with the second ground terminal, and the second ground terminal is connected to the first ground through a resistor.

In one embodiment, the resistor is a link resistance.

In one embodiment, the circuit board is provided with at least one screw hole.

In one embodiment, the screw hole is disposed at a corner position of the circuit board.

In one embodiment, the first ground is a laminated conductive structure disposed in the circuit board.

In one embodiment, the laminated conductive structure of the first ground extends in a straight line at an edge position of the circuit board.

In one embodiment, the laminated conductive structure of the first ground has a width of more than 40 mils.

In one embodiment, the circuit board is at least two layers of circuit boards.

In one embodiment, the two layers of circuit boards includes a top circuit board and a bottom circuit board, and a ground wire on the top board and a ground wire on the bottom board are connected to each other through a via hole on the circuit board.

In one embodiment, the ground wire on the top circuit board and the ground wire on the bottom circuit board form a grid-like frame shape, the ground wire on the top circuit board and the ground wire on the bottom circuit board are connected to each other through the via hole, and the via hole is located at a location where a projection of the ground wire on the top circuit board coincides with a projection of the ground wire on the bottom circuit board.

In one embodiment, the ground wire on the top circuit board is disposed to be perpendicular to the ground wire on the bottom circuit board, the circuit board includes at least one of the ground wire on the top circuit board and the ground wire on the bottom circuit board, the via hole is disposed at a location where the projection of the ground wire on the top circuit board coincides with the projection of the ground wire on the bottom circuit board, and the ground wire on the top circuit board and the ground wire on the bottom circuit board are connected to each other through the via hole.

In one embodiment, an interval between adjacent ground wires on the top circuit board is a fixed value.

In one embodiment, an interval between adjacent ground wires on the bottom circuit board is a fixed value.

The embodiment of the present application further provides a circuit board, including:

a connector configured to connect an onboard system of the circuit board to an external system, wherein the connector is provided with a first ground terminal and connected to a first ground; and a screw hole connected to the first ground to discharge static electricity through the first ground, wherein the circuit board is provided with at least one screw hole, and the screw hole is disposed at a corner position of the circuit board, wherein the first ground is isolated from the ground wire of the circuit board;

wherein the ground wire is provided with a plurality of second ground terminals, one side of the screw hole and one side of the connector are respectively provided with the second ground terminal, and the second ground terminal is connected to the first ground through a link resistance, wherein the first ground is a laminated conductive structure disposed in the circuit board, and extends in a straight line at an edge position of the circuit board, and the laminated conductive structure of the first ground has a width of more than 40 mils, and wherein the circuit board is a two-layer circuit board including a top circuit board and a bottom circuit board, a ground wire on the top circuit board and a ground wire on the bottom circuit board form a grid-like frame shape, the ground wire on the top circuit board and the ground wire on the bottom circuit board are connected to each other through a via hole on the circuit board, and the via hole is located on a location where the ground wire on the top circuit board coincides with the ground wire on the bottom circuit board.

The embodiment of the present application further provides a display device including a display module and a driving module, the driving module including the above-mentioned circuit board.

The circuit board described above includes the first ground isolated from the ground wire of the circuit board, and the first ground is connected to the first ground terminal of the connector on the circuit board and the screw hole respectively. During the assembly of the circuit board, the static electricity concentrated in the screw hole can be discharged to the external ground through the first ground of the circuit board through the first ground terminal of the connector since the ground wire of the circuit board is not connected, thereby solving the problem that the static electricity concentrated in the screw hole cannot be discharged during the assembly of the circuit board.

BRIEF DESCRIPTION OF THE DRAWINGS

In order to more clearly illustrate the technical solutions in the embodiments of the present application or the exemplary technology, the drawings to be used in the embodiments or the description of the exemplary embodiments will be briefly described below. Obviously, the drawings in the following description are only used for a certain embodiment of the present application, and those skilled in the art can obtain the drawings of other embodiments according to the drawings without any creative work.

DETAILED DESCRIPTION OF THE EMBODIMENTS

When an element is considered to be "connected" to another element, it can be directly connected to the other element or there may be centered components. All technical and scientific terms used herein have the same meaning as commonly understood by a person skilled in the art to which this disclosure applies, unless otherwise defined. The terminology used herein is for the purpose of describing particular embodiments, and is not intended to be limiting.

Figure 1:
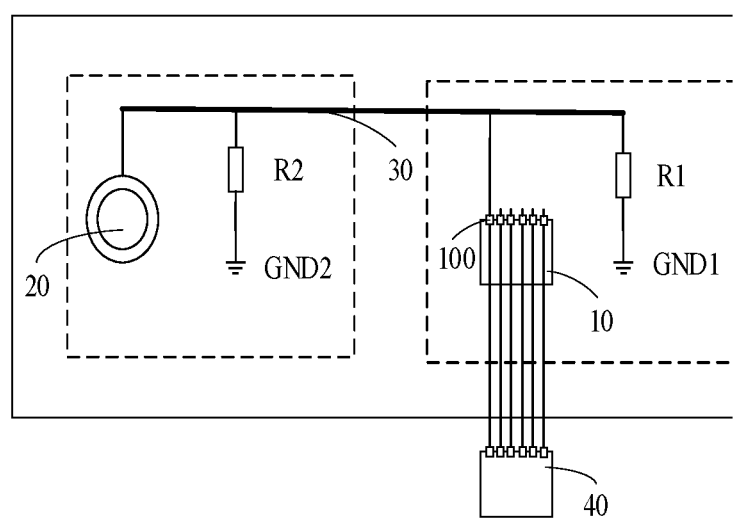
FIG. 1 is a circuit diagram illustrating a circuit board according to an embodiment.

Referring to FIG. 1, FIG. 1 is a circuit diagram illustrating a circuit board according to an embodiment.

A circuit board comprising:

a connector 10 configured to connect an onboard system of the circuit board to an external system 40, wherein the connector 10 is provided with a first ground terminal 100 and connected to the first ground 30; and a screw hole 20, the screw hole 20 is connected to the first ground 30 to discharge static electricity through the first ground 30, wherein the first ground 30 is isolated from the ground wire of the circuit board.

In the above circuit board, since the first ground 30 isolated from the ground wire of the circuit board is included, and the first ground 30 is connected to the first ground terminal 100 of the connector 10 on the circuit board and the screw hole 20 respectively. During assembly of the circuit board, since the ground wire of the circuit board is not connected, the static electricity concentrated in the screw hole 20 can be discharged to the external ground through the first ground 30 in the circuit board through the first ground terminal 100 of the connector 10, thereby solving the problem that during the assembly process, the static electricity concentrated in the screw hole 20 cannot be discharged on the circuit board.

Figure 2:
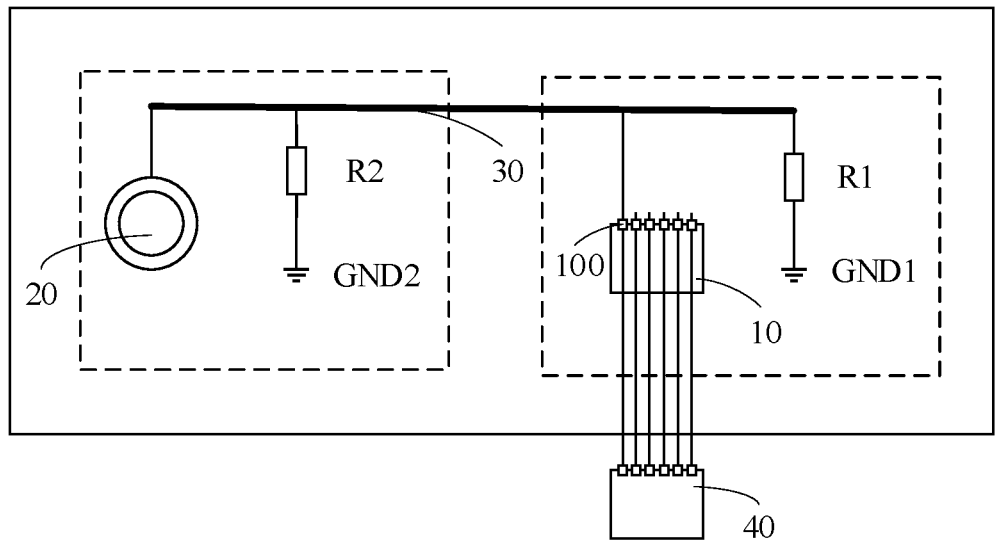
FIG. 2 is a circuit diagram illustrating a circuit board according to another embodiment.

In an embodiment, referring to FIG. 2, FIG. 2 is a schematic circuit diagram illustrating a circuit board according to another embodiment. The ground wire is provided with a plurality of second ground terminals, and one side of the screw hole and one side of the connector are respectively provided with the second ground terminal. The second ground terminal is connected to the first ground through a resistor. During operation of the circuit board, the static electricity concentrated in the screw hole 20 has two discharging paths. A first discharging path is that the static electricity concentrated in the screw hole sequentially reaches the second ground terminal GND2 through the first ground 30 and the resistor R2. Since all the second ground terminals in the circuit board are disposed on the ground wire, the static electricity reaches the second ground terminal GND2 sequentially through the second ground terminal GND1, the resistor R1, and the first ground 30 and is discharged to the external ground through the first ground terminal 100 of the connector 10. A second discharging path is that the static electricity concentrated in the screw hole 20 can pass through the first ground in the circuit board 30 and is discharged to the external earth through the first ground terminal 100. The design of the two discharging paths effectively improves the interference of the ESD in the circuit board only through the first discharging path to cause interference to important components in the circuit board.

Further, the resistors R1 and R2 are link resistance, and since the resistance of the link resistance infinitely approaches 0 ohms, the ESD current can be discharged more quickly.

Further, the circuit board is provided with at least one screw hole 20. Since the ESD is substantially concentrated in the screw hole 20, at least one screw hole 20 should be provided on the circuit board.

Specifically, the screw hole 20 is disposed at a corner position of the circuit board. The screw hole 20 is disposed as close as possible to the corner position of the circuit board, which facilitates the wiring design of the first ground 30 on the circuit board, so that the second discharging path is the shortest discharging path as possible. The reason is that when ESD is present on the circuit board, ESD finds the shortest discharging path on the circuit board, so that when the second discharging path is the shortest discharging path, ESD can effectively avoid interference with components in the circuit board.

Further, the first ground 30 is a laminated conductive structure disposed in a circuit board. The first ground 30 is a laminated conductive structure disposed in the circuit board. Therefore, during the assembly of the circuit board, the first ground 30 is still connected, which avoids the problem that the static electricity cannot be discharged during the assembly process.

Specifically, the laminated conductive structure of the first ground extends in a straight line at an edge position of the circuit board. The laminated conductive structure is located at a position of the edge of the circuit board and extends in a straight line. Since the circuit board is provided with a plurality of signal lines connected to the conductive elements, the static electricity is discharged through the second venting path as much as possible in order to avoid crossing with the signal lines. Therefore, the first ground 30 is disposed as far as possible at the edge position of the circuit board and extends in a straight line, so that the second discharging path is the shortest discharging path, which avoids interference with the on-board components through the first discharging path by the static electricity.

Further, the laminated conductive structure of the first ground 30 has a width of more than 40 mils, which is effective to withstand ESD interference.

Further, the circuit board is at least two layers of circuit boards. The circuit board is set as a multi-layer board. In the multi-layer board, since a complete ground plane is close to the wiring, the ESD can be more quickly coupled to the low-impedance plane, thereby protecting the key signals.

Figure 3:
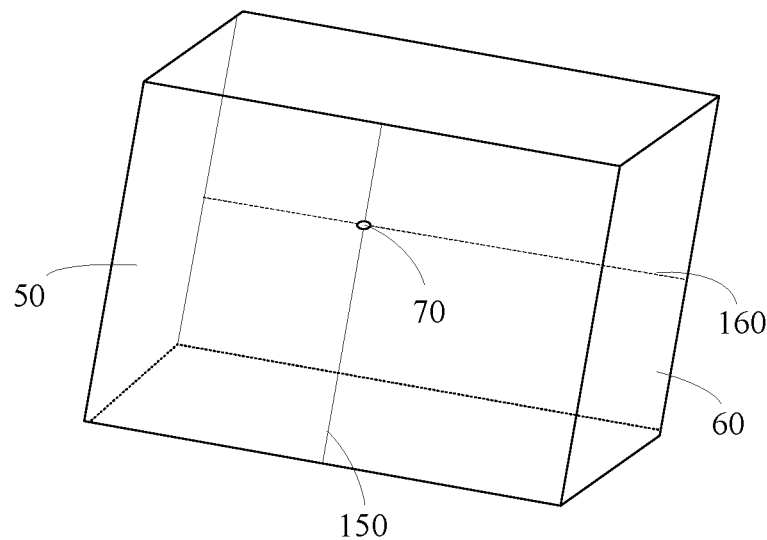
FIG. 3 is a schematic structural diagram illustrating a circuit board according to another embodiment.

In an embodiment, referring to FIG. 3, FIG. 3 is a schematic structural diagram illustrating a circuit board according to another embodiment. In FIG. 3, the first ground wire 150 on the top circuit board 50 is a solid line, and the second ground wire 160 on the bottom circuit board 60 is a dotted line. The two-layer circuit board includes a top circuit board 50 and a bottom circuit board 60. The first ground wire 150 on the top circuit board 50 is connected to the second ground wire 160 on the bottom circuit board 60 through a via hole 70 on the circuit board. Since the two-layer circuit board includes the top circuit board 50 and the bottom circuit board 60, and the two-layer circuit board can be provided with corresponding signal lines and ground wires, thereby simplifying complicated signal lines and ground wires on the single-layer circuit board, which is convenient for the wiring of the first ground 30, making the second discharging path be the shortest discharging path.

Further, the first ground wire 150 on the top circuit board 50 and the second ground wire 160 on the bottom circuit board 60 form a grid-like frame shape.

Figure 4:
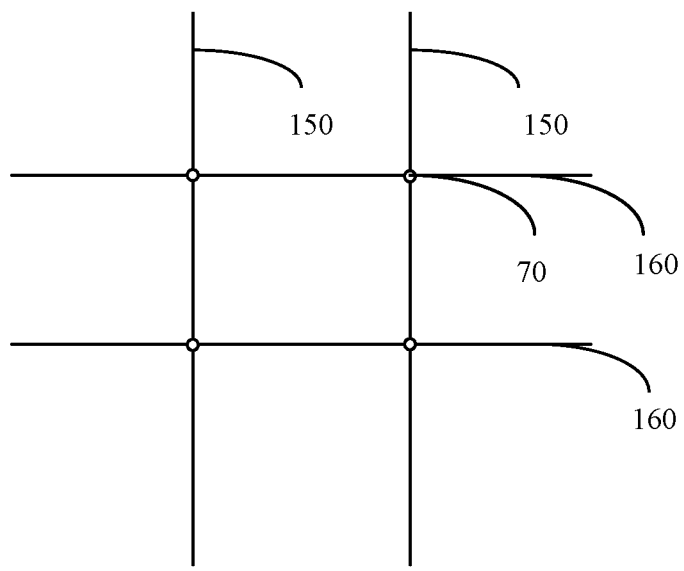
FIG. 4 is a schematic diagram illustrating the distribution of ground wires in a circuit board according to an embodiment.

Referring to FIG. 4, FIG. 4 is a schematic diagram illustrating the distribution of ground wires in the circuit board according to an embodiment. The first ground wire 150 on the circuit board 50 is connected to the second ground wire 160 on the bottom circuit board 60 through the via hole 70, and the via hole 70 is located at a location where a projection of the first ground wire 150 on the top circuit board 50 coincides with a projection of the second ground wire 160 on the bottom circuit board 60.

Specifically, the first ground wire 150 on the top circuit board 50 is disposed to be perpendicular to the second ground wire 160 on the bottom circuit board 60, and the circuit board includes at least one of the first ground wire 150 on the top circuit board 50 and the second ground wire 160 on the bottom circuit board 60. The via hole 70 is disposed at a location where the projection of the first ground wire 150 on the top circuit board 50 coincides with the projection of the second ground wire 160 on the bottom circuit board 60, and the first ground wire 150 on the top circuit board 50 is connected to the second ground wire 160 on the bottom circuit board 60 through the via hole 70.

The via hole 70 is disposed at a location where the projection of the first ground wire 150 on the top circuit board 50 coincides with the projection of the second ground wire 160 on the bottom circuit board 60, and the first ground wire 150 on the top circuit board 50 is connected to the second ground wire 160 on the bottom circuit board 60 through the via hole 70, which avoids the problem that one via hole 70 fails and the entire circuit fails to operate properly, while a trend of the first ground wire 150 on the top circuit board 50 is perpendicular to a trend of the second ground wire 160 on the bottom circuit board 60, allowing each ground wire has the shortest length and the lowest impedance.

Specifically, an interval between adjacent first ground wires 150 on the top circuit board 50 is a fixed value.

Specifically, an interval between adjacent second ground wires 160 on the top circuit board 60 is a fixed value.

The interval between adjacent first ground wires 150 on the top circuit board 50 and the interval between adjacent second ground wires 160 on the bottom circuit boards 60 being set to a fixed value can facilitate the configuration of the signal line on the circuit board, so the signal line can be arranged between two adjacent first ground wires 150 on the top circuit board 50, and between two adjacent second ground wires 160 on the bottom circuit board 60, which avoids the situation where the ground environment is damaged due to the cross configuration between different signal lines.

In one embodiment, a circuit board is provided, including:

a connector 10 configured to connect the onboard system of the circuit board to the external system 40, wherein the connector 10 is provided with a first ground terminal 100 and connected to the first ground 30; and a screw hole 20 connected to the first ground 30 to discharge static electricity through the first ground 30, wherein the circuit board is provided with at least one screw hole 20, and the screw hole 20 is disposed at a corner position of the circuit board, wherein the first ground 30 is isolated from the ground wire of the circuit board, wherein the ground wire is provided with a plurality of second ground terminals, one side of the screw hole 20 and one side of the connector 10 are respectively provided with the second ground terminal, and the second ground terminal is connected to the first ground through the link resistance, wherein the first ground 30 is a laminated conductive structure disposed in the circuit board, and extends in a straight line at an edge position of the circuit board, and the laminated conductive structure of the first ground 30 has a width of 40 mil or more, and wherein the circuit board is a two-layer circuit board, and the two-layer circuit board comprises a top circuit board 50 and a bottom circuit board 60, a first ground wire 150 on the top circuit board 50 and a second ground wire 160 on the bottom circuit board 60 form a grid-like frame shape, the first ground wire 150 on the top circuit board 50 and the second ground wire 160 on the bottom circuit board 60 are connected to each other through a via hole 70 on the circuit board, and the via hole 70 is located on a location where a projection of the first ground wire 150 on the top circuit board 50 coincides with a projection of the second ground wire 160 on the bottom circuit board 60.

The above circuit board not only solves the problem that the static electricity of the screw hole concentrated in the screw hole cannot be discharged during the assembly process, but also separates the discharge path during the operation of the circuit board, avoiding and reducing the possibility of components in the circuit board being disturbed by ESD.

The present application also provides a display device including a display module and a driving module. The driving module includes the above-mentioned circuit board. The interference of the ESD to various components of the display device is effectively avoided due to the design of the circuit board.

The technical features of the above-described embodiments may be combined in any combination. For the sake of brevity of description, all possible combinations of the technical features in the above embodiments are not described. However, as long as there is no contradiction between the combinations of these technical features, all should be considered as the scope of this specification.

The above-mentioned embodiments are merely illustrative of several embodiments of the present application, and the description thereof is more specific and detailed, but is not to be construed as limiting the scope of the claims. It should be noted that a number of variations and modifications may be made by those skilled in the art without departing from the spirit and scope of the present application. Therefore, the scope of the disclosure should be determined by the appended claims.

What is claimed is:

1. A circuit board, comprising:
a connector configured to connect an onboard system of the circuit board to an external system, wherein the connector is provided with a first ground terminal and connected to a first ground; and
a screw hole connected to the first ground to discharge static electricity through the first ground,
wherein the first ground is isolated from a ground wire of the circuit board;
wherein the ground wire is provided with a plurality of second ground terminals, one side of the screw hole and one side of the connector are respectively provided with the second ground terminal, and the second ground terminal is connected to the first ground through a resistor, wherein the screw hole and the connector are indirectly connected to the second ground terminals through the first ground;
wherein the resistor is a link resistance.

2. The circuit board according to claim 1, wherein the circuit board is provided with at least one screw hole.

3. The circuit board according to claim 1, wherein the screw hole is disposed at a corner position of the circuit board.

4. The circuit board according to claim 1, wherein the first ground is a laminated conductive structure disposed in the circuit board.

5. The circuit board according to claim 4, wherein the laminated conductive structure of the first ground extends in a straight line at an edge position of the circuit board.

6. The circuit board according to claim 4, wherein the laminated conductive structure of the first ground has a width of more than 40 mils.

7. The circuit board according to claim 1, wherein the circuit board is at least two layers of circuit boards.

8. The circuit board according to claim 7, wherein the two layers of circuit boards comprises a top circuit board and a bottom circuit board, and a first ground wire on the top circuit board and a second ground wire on the bottom circuit board are connected to each other through a via hole on the circuit board.

9. The circuit board according to claim 8, wherein the first ground wire on the top circuit board and the second ground wire on the bottom circuit board form a grid-like frame shape, the first ground wire on the top circuit board and the second ground wire on the bottom circuit board are connected to each other through the via hole, and the via hole is located at a location where a projection of the first ground wire on the top circuit board coincides with a projection the second ground wire on the bottom circuit board.

10. The circuit board according to claim 9, wherein the first ground wire on the top circuit board is disposed to be perpendicular to the second ground wire on the bottom circuit board, the circuit board comprises at least one of the first ground wire on the top circuit board and the second ground wire on the bottom circuit board, the via hole is disposed at a location where the projection of the first ground wire on the top circuit board coincides with the projection of the second ground wire on the bottom circuit board, and the first ground wire on the top circuit board and the second ground wire on the bottom circuit board are connected to each other through the via hole.

11. The circuit board according to claim 10, wherein an interval between adjacent first ground wires on the top circuit board is a fixed value.

12. The circuit board according to claim 10, wherein an interval between adjacent second ground wires on the bottom circuit board is a fixed value.

13. A circuit board comprising:
a connector configured to connect an onboard system of the circuit board to an external system, wherein the connector is provided with a first ground terminal and connected to a first ground; and
a screw hole connected to the first ground to discharge static electricity through the first ground, wherein the circuit board is provided with at least one screw hole, and the screw hole is disposed at a corner position of the circuit board,
wherein the first ground is isolated from a ground wire of the circuit board,
wherein the ground wire is provided with a plurality of second ground terminals, one side of the screw hole and one side of the connector are respectively provided with the second ground terminal, and the second ground terminal is connected to the first ground through a link resistance, wherein the screw hole and the connector are indirectly connected to the second ground terminals through the first ground,
wherein the first ground is a laminated conductive structure disposed in the circuit board, and extends in a straight line at an edge position of the circuit board, and the laminated conductive structure of the first ground has a width of more than 40 mils, and
wherein the circuit board is a two-layer circuit board comprising a top circuit board and a bottom circuit board, a first ground wire on the top circuit board and a second ground wire on the bottom circuit board form a grid-like frame shape, the first ground wire on the top circuit board and the second ground wire on the bottom circuit board are connected to each other through a via hole on the circuit board, and the via hole is located on a location where a projection of the first ground wire on the top circuit board coincides with a projection of the second ground wire on the bottom circuit board.

14. A display device comprising a display module and a drive module, the drive module comprising the circuit board according to claim 1.

* * * * *